United States Patent
Kim et al.

(10) Patent No.: US 10,848,173 B2
(45) Date of Patent: Nov. 24, 2020

(54) ANALOG-TO-DIGITAL CONVERTER CORRECTING FREQUENCY CHARACTERISTICS AND SEMICONDUCTOR DEVICE INCLUDING THE SAME

(71) Applicant: Seoul National University R&DB Foundation, Seoul (KR)

(72) Inventors: Suhwan Kim, Seoul (KR); Junsoo Cho, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/557,664

(22) Filed: Aug. 30, 2019

(65) Prior Publication Data
US 2019/0386675 A1 Dec. 19, 2019

Related U.S. Application Data

(63) Continuation of application No. PCT/KR2018/001783, filed on Feb. 12, 2018.

(30) Foreign Application Priority Data

Mar. 2, 2017 (KR) .......................... 10-2017-0026903

(51) Int. Cl.
*H03M 1/06* (2006.01)
*H03M 3/00* (2006.01)
(Continued)

(52) U.S. Cl.
CPC ........ *H03M 3/344* (2013.01); *H03H 17/0411* (2013.01); *H03H 17/0614* (2013.01);
(Continued)

(58) Field of Classification Search
CPC ........ H03M 3/344; H03M 3/368; H03M 3/37; H03M 3/494; H03M 3/462; H03M 1/0626;
(Continued)

(56) References Cited

U.S. PATENT DOCUMENTS 5,646,621 A * 7/1997 Cabler .................... G06F 7/026
341/143
9,414,165 B2 8/2016 Khenkin et al.
(Continued)

FOREIGN PATENT DOCUMENTS

KR 100189524 B1 6/1999
KR 100360631 B1 1/2003
(Continued)

OTHER PUBLICATIONS

Embedded.com, Understanding cascaded integrator-comb filters, Mar. 31, 2005 Embedded Staff, URL: https://www.embedded.com/understanding-cascaded-integrator-comb-filters/ (Year: 2005).*
(Continued)

*Primary Examiner* — Jean B Jeanglaude
(74) *Attorney, Agent, or Firm* — William Park & Associates Ltd.

(57) ABSTRACT

An analog-to-digital converter (ADC) includes a modulator configured to oversample an input signal generated from an output signal of a transducer; and a filter configured to perform a decimation operation on an output from the modulator and a frequency characteristics correction operation according to a filter control signal on the output from the modulator, wherein the frequency characteristics correction operation is performed to complement a frequency characteristics of the output signal of the transducer such that overall frequency characteristics of the transducer and the filter be flat in a signal band.

19 Claims, 11 Drawing Sheets

(51) Int. Cl.
*H03H 17/04* (2006.01)
*H03H 17/06* (2006.01)
*H04R 3/04* (2006.01)
*H04R 19/04* (2006.01)

(52) U.S. Cl.
CPC ........ *H03H 17/0671* (2013.01); *H03M 3/494* (2013.01); *H04R 3/04* (2013.01); *H04R 19/04* (2013.01); *H04R 2201/003* (2013.01)

(58) Field of Classification Search
CPC .......... H03M 3/458; H03M 1/08; H03M 3/68; H03H 17/0411; H03H 17/0614; H03H 17/0671; H03H 17/0664; H03H 17/045; H03H 2017/0081; H03H 2017/009; H04R 3/04; H04R 19/04; H04R 2201/003; H04R 19/005
USPC ......................................................... 341/118
See application file for complete search history.

(56) References Cited

U.S. PATENT DOCUMENTS

| | | | |
|---|---|---|---|
| 2015/0214912 A1 | 7/2015 | Khenkin et al. | |
| 2015/0333732 A1* | 11/2015 | Shaohua | H03H 17/0671 708/207 |
| 2016/0157017 A1* | 6/2016 | Lesso | H04R 19/005 381/71.7 |
| 2016/0344358 A1 | 11/2016 | Oliaei | |

FOREIGN PATENT DOCUMENTS

| | | |
|---|---|---|
| KR | 1020090115450 A | 11/2009 |
| KR | 1020110098106 A | 9/2011 |
| KR | 1020160005721 A | 1/2016 |
| KR | 1020160124698 A | 10/2016 |

OTHER PUBLICATIONS

Crochiere et al., Interpolation and Decimation of Digital Signals—A Tutorial Review, IEEE, Proceedings of the IEEE, vol. 69, No. 3, Mar. 1981 (Year: 1981).*

* cited by examiner

FIG. 11B tion according to a filter control signal on the output from the modulator, wherein the frequency characteristics correction operation is performed to complement a frequency characteristics of the output signal of the transducer such that overall frequency characteristics of the transducer and the filter be flat in a signal band.

In accordance with the present teachings, a semiconductor device may include a transducer; and an analog-to-digital converter (ADC), wherein the ADC may include a modulator configured to oversample an input signal generated from an output signal of a transducer; and a filter configured to perform a decimation operation on an output from the modulator and a frequency characteristics correction operation according to a filter control signal on the output from the modulator, wherein the frequency characteristics correction operation is performed to complement a frequency characteristics of the output signal of the transducer such that overall frequency characteristics of the transducer and the filter be flat in a signal band.

ANALOG-TO-DIGITAL CONVERTER CORRECTING FREQUENCY CHARACTERISTICS AND SEMICONDUCTOR DEVICE INCLUDING THE SAME

CROSS-REFERENCE TO RELATED APPLICATIONS

This application is a continuation of and claims priority to PCT application No. PCT/KR2018/001783, filed on Feb. 12, 2018, which claims priority to Korean Patent Application No. 10-2017-0026903, filed on Mar. 2, 2017, which is incorporated herein by reference in its entirety.

BACKGROUND

1. Technical Field

Various embodiments generally relate to an analog-to-digital converter (ADC) and a semiconductor device including the ADC and more particularly to an ADC for correcting frequency characteristics of a signal in a signal band and for outputting the signal and a semiconductor device including the ADC.

2. Related Art

Ideally, a transducer, such as a microphone, should have a flat frequency response in a signal band.

However, in general transducers, there is a resonant frequency that causes resonance, and a gain increases around the resonant frequency.

For example, frequency characteristics of a capacitive microphone manufactured by using MEMS technology is affected by an internal volume, size and depth of a sound port, and etc., and frequency characteristics of other microphones manufactured by applying a piezo method or other methods are affected by various factors including structural characteristics thereof.

Figure 1:
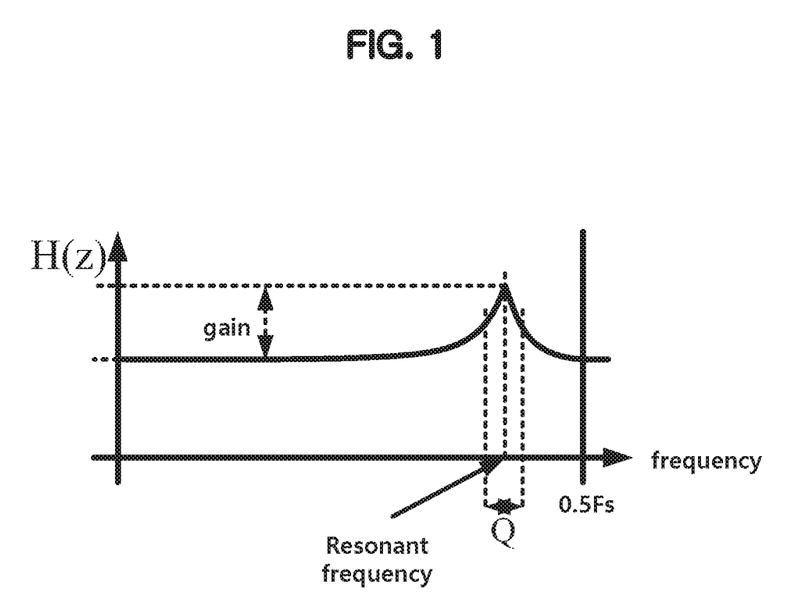
FIGS. 1 and 2 are graphs showing frequency characteristics of transducers.
Figure 2:
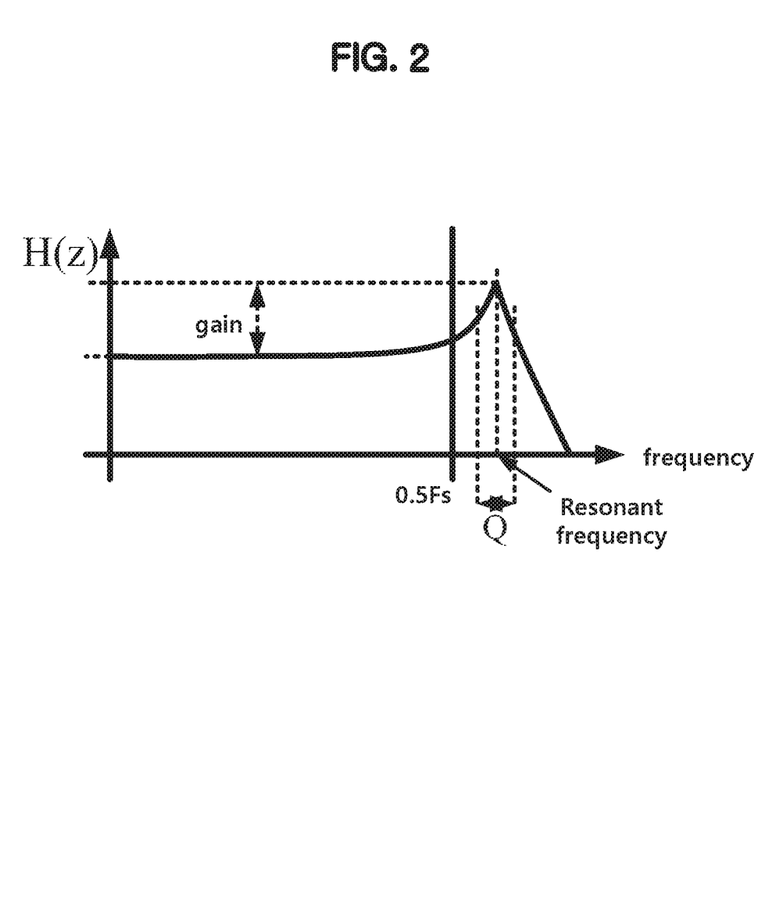

If a resonant frequency is present in the signal band as shown in FIG. 1 or if a resonant frequency is outside of the signal band and if the resonant frequency is located close to the signal band like FIG. 2, severe distortion may occur in the signal band and performance of a system may be degraded. In FIGS. 1 and 2, Fs represents Nyquist sampling frequency.

Conventionally, an analog filter is provided at an output terminal of a transducer, and a method of calibrating the analog filter by analyzing a signal obtained by digitally converting the output of the transducer is used.

The conventional technique has a problem making a configuration of a system complicated because of feedback controlling a separate analog filter for correcting the frequency characteristics.

Accordingly, a technique for correcting frequency characteristics with a simpler configuration that does not use an analog filter connected to a transducer is required.

SUMMARY

In accordance with the present teachings, an analog-to-digital converter (ADC) may include a modulator configured to oversample an input signal generated from an output signal of a transducer; and a filter configured to perform a decimation operation on an output from the modulator and a frequency characteristics correction operation according to

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 3:
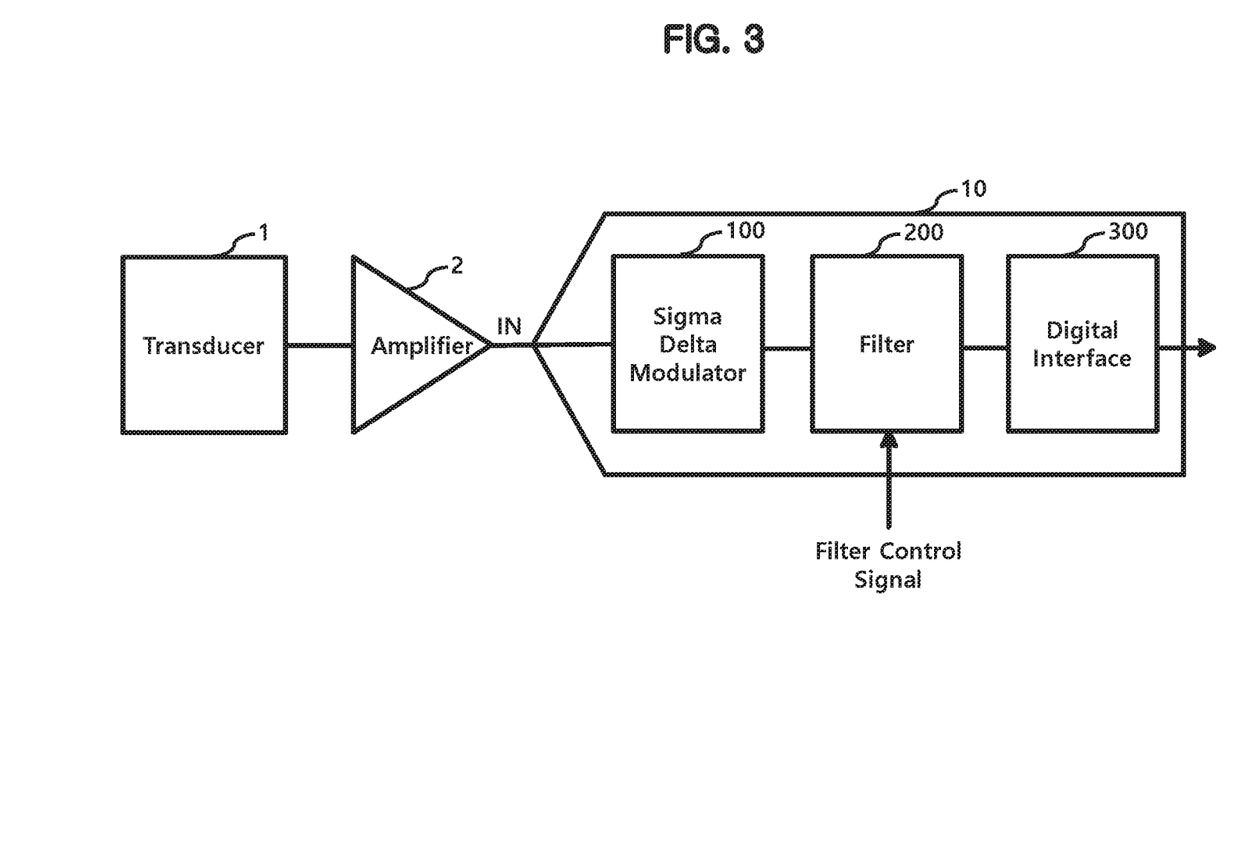
FIG. 3 shows a block diagram illustrating a semiconductor device according to an embodiment of the present disclosure.

FIG. 3 is a block diagram illustrating a semiconductor device according to an embodiment of the present disclosure.

A semiconductor device according to an embodiment of the present disclosure includes a transducer 1 and an ADC 10.

The semiconductor device may further include an amplifier 2 that buffers or amplifies an output of the transducer 1 and provides the output thereof to the ADC 10.

The transducer 1 is a device that converts various signals such as voice and temperature into analog signals, and may include, for example, a microphone and an ultrasonic sensor.

The transducer 1 may be a MEMS transducer manufactured by MEMS technology.

An input signal IN output from the transducer 1 and input to the ADC 10 preferably has a constant frequency characteristics in a signal band, but as described above, a gain of the input signal IN in the signal band may not be constant or flat in the signal band according to a location of a resonant frequency.

In the present embodiment, the ADC 10 for correcting frequency characteristics such that a gain be constant or flat in the signal band is included.

In this embodiment, the ADC 10 includes a sigma delta modulator (SDM) 100 and a filter 200.

The ADC 10 may further include a digital interface 300 for outputting a digital signal output from the ADC 10.

When a dynamic range of the transducer 1 is wide, it is preferable to use the ADC 100 having a high signal-to-noise (SNR) characteristics in order to stably sample a signal from the transducer 1 in the entire dynamic range.

In this embodiment, the ADC 100 is a sigma delta type having a high SNR characteristics.

In the present embodiment, the SDM 100 oversamples the input signal IN and performs a noise shaping operation.

The SDM 100 samples the input signal IN at a higher frequency Fos than a Nyquist sampling frequency Fs which corresponds to twice of a bandwidth of a signal.

The noise shaping operation causes the frequency of the noise component in the output signal of the SDM 100 to move to a higher frequency band than the signal band.

Since the SDM 100 itself is well known, a detailed description thereof will be omitted.

In this embodiment, the filter 200 performs two operations.

The first operation is a decimation operation for converting a signal having a higher sampling rate output from the SDM 100 into a signal having a lower sampling rate.

The decimation operation includes a noise filtering operation for removing a noise component and a sample removal operation for removing some samples.

Although it is common to perform the sample removal operation after the noise filtering operation, the sample removal operation may be performed before the noise filtering operation, or the sample removal operation may be performed during the noise filtering operation.

The second operation is a frequency characteristics correction operation for correcting the frequency characteristics of the input signal IN to be flattened in the signal band.

The frequency characteristics of the input signal IN may be determined corresponding to the frequency characteristics of the transducer 1 or the frequency characteristics of the transducer 1 and the amplifier 2.

In the frequency characteristics correction operation, the filter 200 may be controlled by a filter control signal to control the frequency characteristics.

In the present embodiment, the filter 200 includes a plurality of sub filters connected in series.

In the present embodiment, the filter 200 may control the filtering characteristics by applying the filter control signal to at least one of the plurality of sub filters in order to perform the above-described correction operation.

Figure 4:
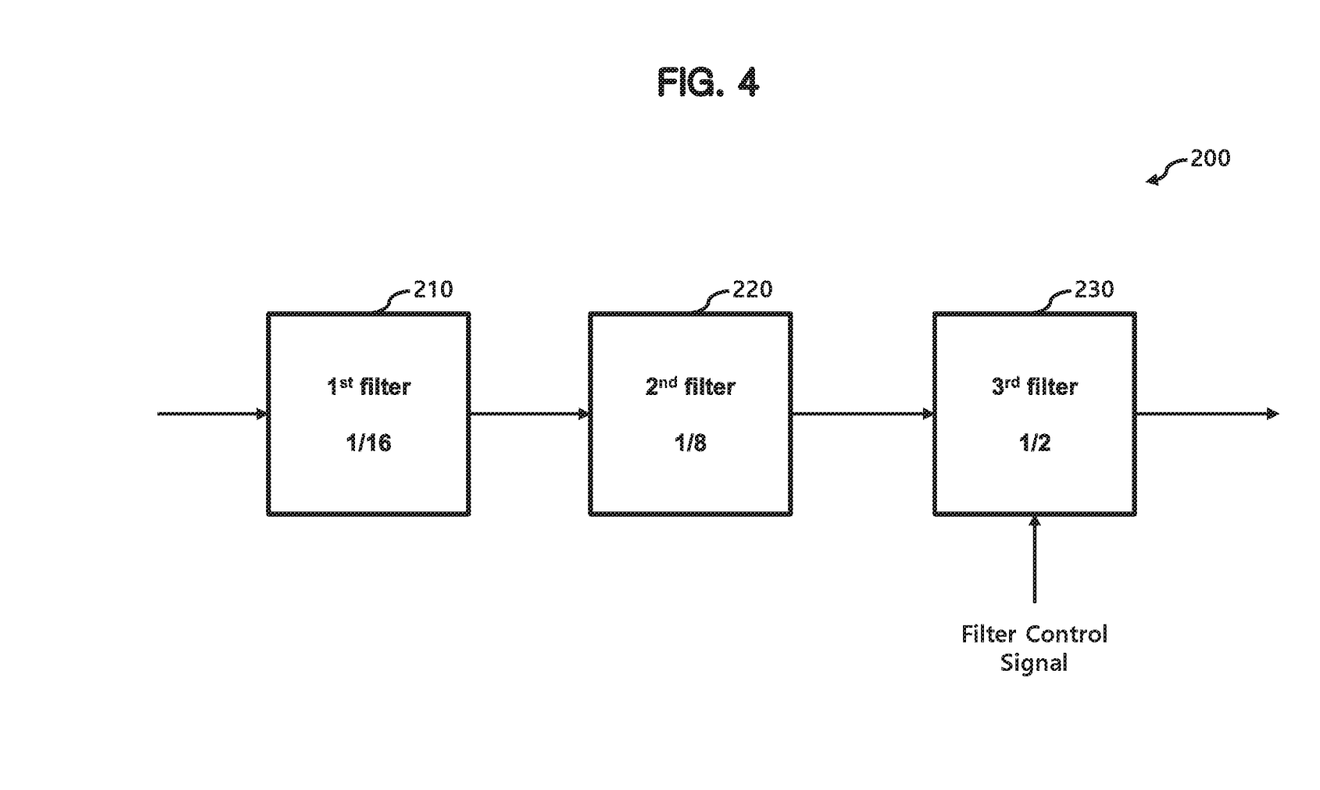
FIG. 4 shows a block diagram illustrating a filter according to an embodiment of the present disclosure.

FIG. 4 is a block diagram illustrating a filter 200 according to an embodiment of the present disclosure.

In the present embodiment, the filter 200 includes three sub filters, that is, a first filter 210, a second filter 220, and a third filter 230, but the number of the sub filters may vary according to embodiments.

In the present embodiment, each of the first filter 210 and the second filter 220 includes a cascaded integrator and comb (CIC) filter, and the third filter 230 includes a finite impulse response (FIR) filter.

In general, performance is degraded when a decimation operation with a CIC filter is performed at a lower rate, and a circuit implementation of a FIR filter may become complicated though a noise filtering may be performed as desired.

In the embodiment of FIG. 4, the first and second filters 210 and 220 which perform decimation operations at a relatively higher rate are implemented with CIC filters and the third filter 230 is implemented with a FIR filter considering the characteristics of the CIC filter and the FIR filter.

In FIG. 4, the third filter 230 is lastly positioned, but the position of the third filter 230 may vary according to embodiments.

The first filter 210, the second filter 220, and the third filter 230 perform the decimation operations, and the third filter 230 may further perform the frequency characteristics correction operation.

Accordingly, each of the first filter 210 and the second filter 220 may be referred to as a decimation filter, and the third filter 230 may be referred to as a correction filter.

Figure 5:
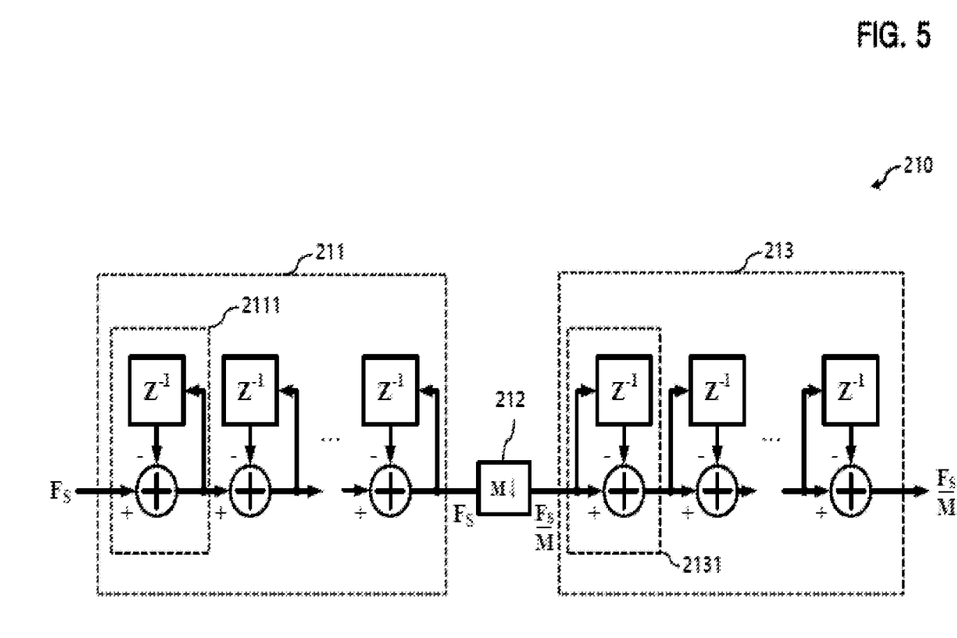
FIG. 5 shows a block diagram illustrating a first filter according to an embodiment of the present disclosure.

FIG. 5 is a block diagram illustrating a detailed structure of the first filter 210 of FIG. 4.

As described above, the first filter 210 includes a CIC filter.

The first filter 210 includes an integrator 211, a sample remover 212, and a comb filter 213.

The integrator 211 includes a plurality of unit integrators 2111 and the comb filter 213 includes a plurality of unit comb filters 2131.

Since the integrator 211 and the comb filter 213 are well known, a detailed description thereof will be omitted.

The sample remover 212 leaves one sample out of M, which is 16 in FIG. 5, and removes the remaining samples.

Although the connection order of the sample remover 212 and the comb filter 213 may be changed, circuit implementation may be easier when the comb filter 213 is connected after the sample remover 212 as shown in FIG. 5.

The second filter 220 may have a structure substantially as same as that of the first filter 210 except M, which is 8 for the second filter 220 as shown in FIG. 4.

Figure 6:
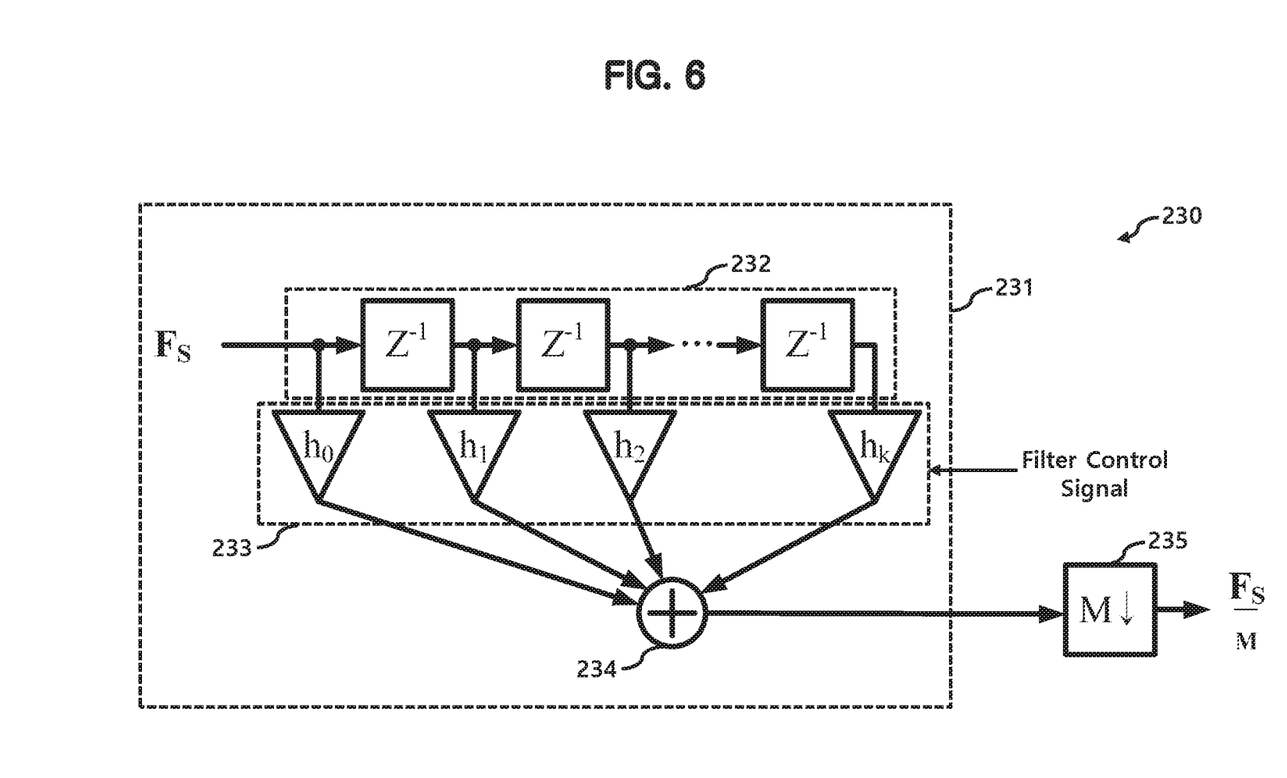
FIGS. 6 to 8 shows block diagrams each illustrating a third filter according to an embodiment of the present disclosure.

FIG. 6 is a block diagram illustrating a detailed structure of the third filter 230.

In FIG. 6, the third filter 230 includes a FIR filter.

The third filter 230 includes a correction filter 231 and a sample remover 235.

The correction filter 231 is a FIR filter which includes a delay circuit 232, an amplifier circuit 233, and an adder 234.

The delay circuit 232 delays an input signal to the third filter 230 and includes a plurality of unit delay elements connected in series.

The amplifier circuit 233 includes a plurality of unit amplifiers each amplifies a corresponding signal among the input signal and signals delayed by the plurality of unit delay elements by a corresponding constant among constants $h0$, $h1, h2, \ldots, hk$.

The adder 234 sums outputs of the plurality of unit amplifiers.

At this time, the constants h0, h1, h2, . . . , hk may be controlled by the filter control signal.

By being controlled by the filter control signal, the ADC 100 outputs a signal having a flat frequency characteristics in the signal band.

The sample remover 235 removes samples at a ratio of one out of M, which is 2 in FIG. 6, from an output of the correction filter 231.

Figure 7:
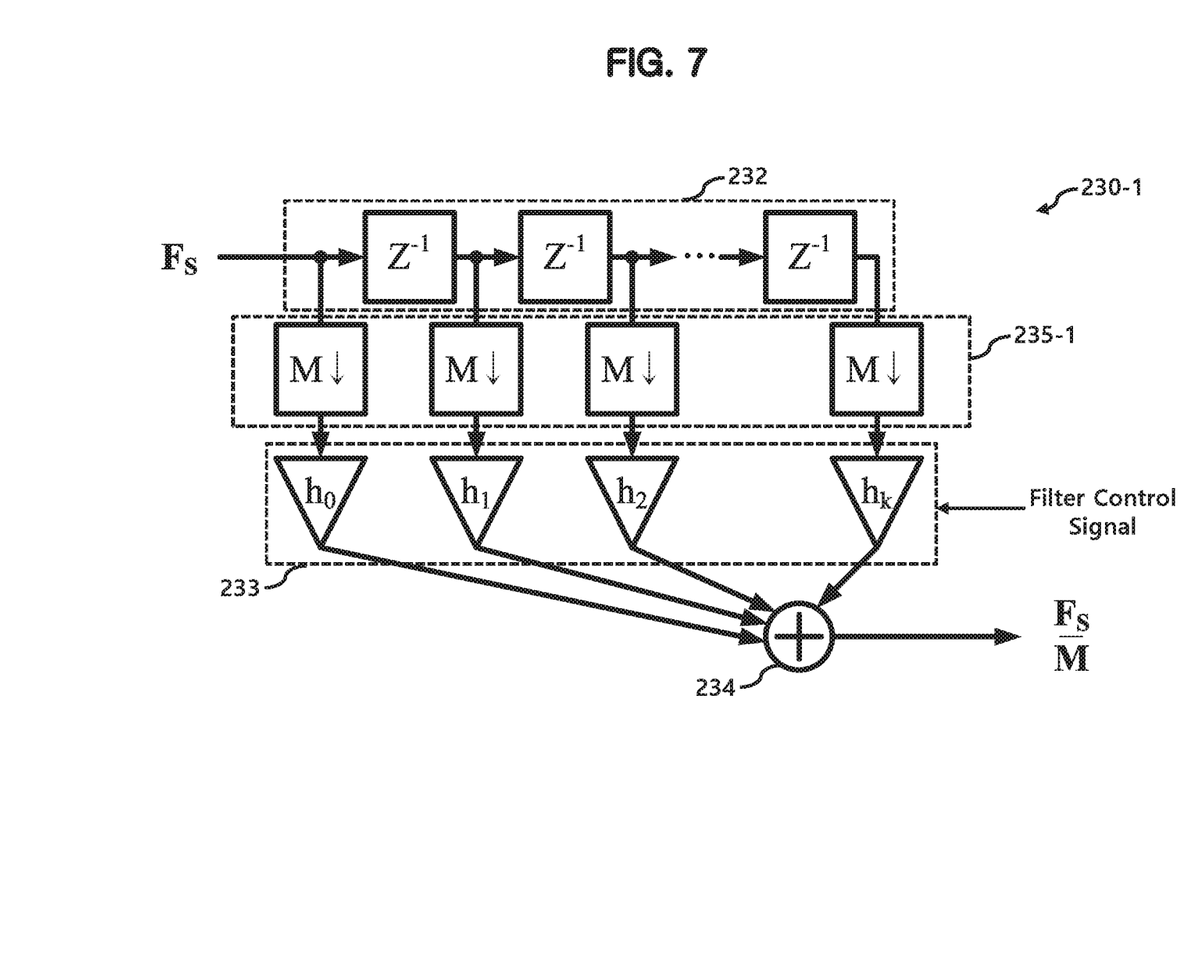

FIG. 7 is a block diagram illustrating a structure of a third filter 230-1 according to another embodiment of the present disclosure.

The third filter 230-1 shown in FIG. 7 includes a FIR filter similar to the third filter 230 of FIG. 6.

In the embodiment of FIG. 6, the sample remover 235 is connected after the adder 234, but in the embodiment of FIG. 7 the sample remover 235-1 is positioned before the amplifier circuit 233.

The embodiment of FIG. 7 and the embodiment of FIG. 6 have substantially the same signal processing results, but when the circuit is implemented as shown in FIG. 7, the circuit implementation may be easier.

Figure 8:
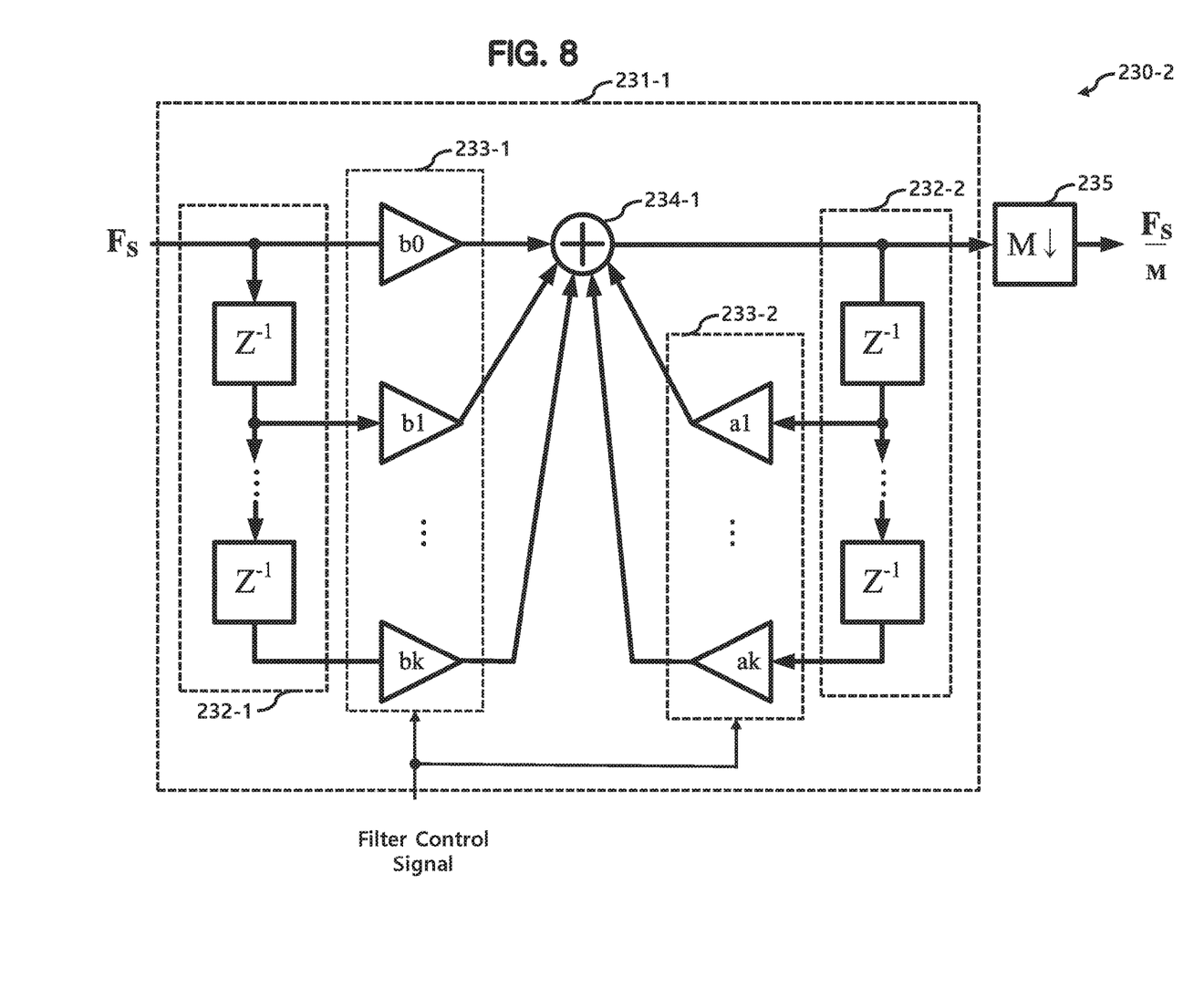

FIG. 8 is a block diagram illustrating a structure of a third filter 230-2 according to another embodiment of the present disclosure.

Unlike the embodiments of FIGS. 6 and 7, the third filter 230-2 shown in FIG. 8 includes an infinite impulse response (IIR) filter.

In the present embodiment, the third filter 230-2 includes a correction filter 231-1 and a sample remover 235.

The correction filter 231-1 is an IIR filter and includes a first delay circuit 232-1, a first amplifier circuit 233-1, an adder 234-1, and a second delay circuit 232-2, and a second amplifier circuit 233-2.

The first delay circuit 232-1 delays an input signal to the third filter 230-2 and includes a plurality of first unit delay elements connected in series.

The first amplifier circuit 233-1 includes a plurality of first unit amplifiers each amplifies a corresponding signal among the input signal and signals delayed by the plurality of first unit delay elements by a corresponding constant among constants b0, b1, . . . , bk.

The second delay unit 232-2 delays an output signal of the correction filter 231-1 and includes a plurality of second unit delay elements connected in series.

The second amplifier 233-2 includes a plurality of second unit amplifiers each amplifies a corresponding signal among the output signal and signals delayed by the plurality of second unit delay elements by a corresponding constant among constants a1, . . . , ak.

The adder 234-1 adds the outputs of the plurality of first unit amplifiers and the plurality of second unit amplifiers and provides the output signal to the sample remover 235.

At this time, the constants a0, a1, . . . , ak, b1, . . . , bk may be controlled by the filter control signal.

By being controlled by the filter control signal, the ADC 100 outputs a signal having flat or constant frequency characteristics in the signal band.

The sample remover 235 removes the sample at a ratio of one out of M, which is 2 in FIG. 8, from the output of the correction filter 231-1.

Figure 9:
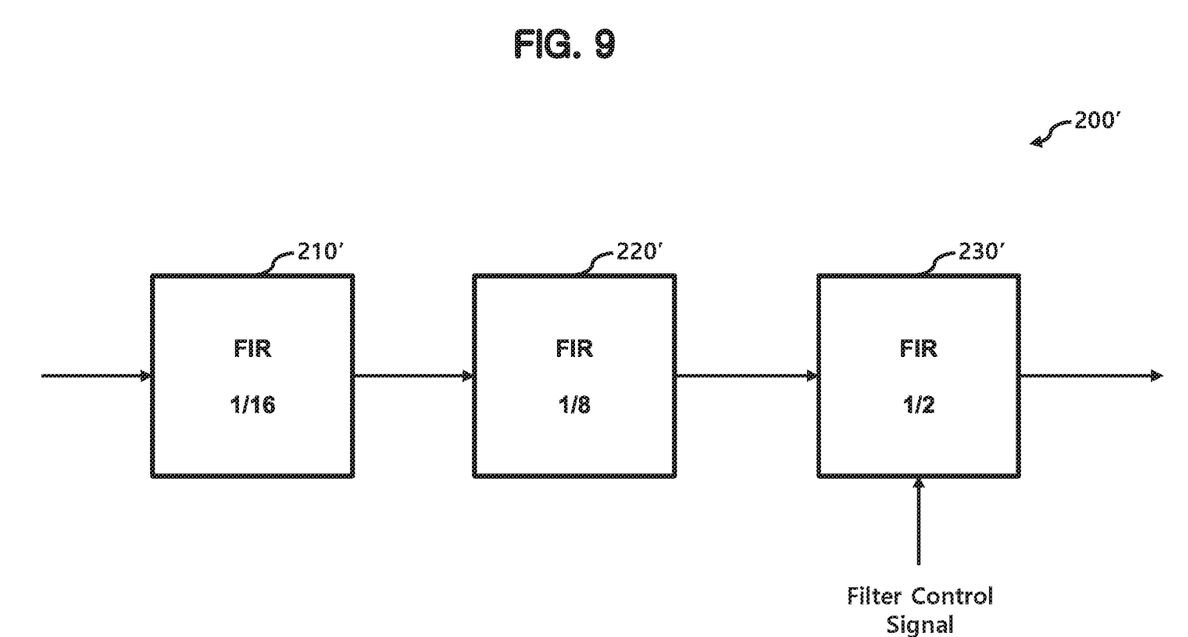
FIG. 9 shows a block diagram illustrating a filter according to another embodiment of the present disclosure.

FIG. 9 is a block diagram of a filter 200' according to another embodiment of the present disclosure.

In the embodiment of FIG. 9, unlike the embodiment of FIG. 4, each of the sub filters 210', 220', and 230' includes a FIR filter.

In this case, each of the sub filters 210', 220', and 230' may be implemented as illustrated in FIG. 6 or FIG. 7.

However, the first filter 210' and the second filter 220' are not controlled by the filter control signal and may receive predetermined constants instead.

In FIG. 9, a detailed disclosure regarding the sub filters will be omitted.

In FIG. 9, the third filter 230' is lastly positioned, but the position of the third filter 230 may vary according to embodiments.

Those skilled in the art can design and modify various filters 200 with reference to the above disclosure.

For example, an embodiment in which at least one or more of the sub filters are implemented to include an IIR filter as shown in FIG. 8 may also be readily derived from the foregoing disclosure.

As another example, various embodiments where the sub filters are implemented with one or more CIC filters, one or more of FIR filters, and/or one or more IIR filters may be easily derived from the above disclosure.

In addition, embodiments in which the filter control signal controls one or more sub filters may also be derived within the scope of the present invention.

Various combinations except the above examples may be possible, and thus a detailed description thereof will be omitted since a person of skilled in the art can easily derive the same by referring to the above disclosure.

In FIG. 3, the filter control signal may be determined by monitoring the output of the SDM 100.

In this case, a monitoring device for monitoring the output of the SDM 100 may be present in an external tester used for product manufacturing process. In this case the monitoring device is external to the ADC 10.

For example, in the manufacturing process of MEMS microphones, the resonant frequency and Q constant may be changed by process variation. Such a change may be detected during a test phase and different filter control signals for each product may be determined.

In another embodiment, a monitoring device may be located inside or outside the ADC 10 to continuously monitor and reflect the output of the SDM 100 to continuously change the filter control signal.

Figure 10A:
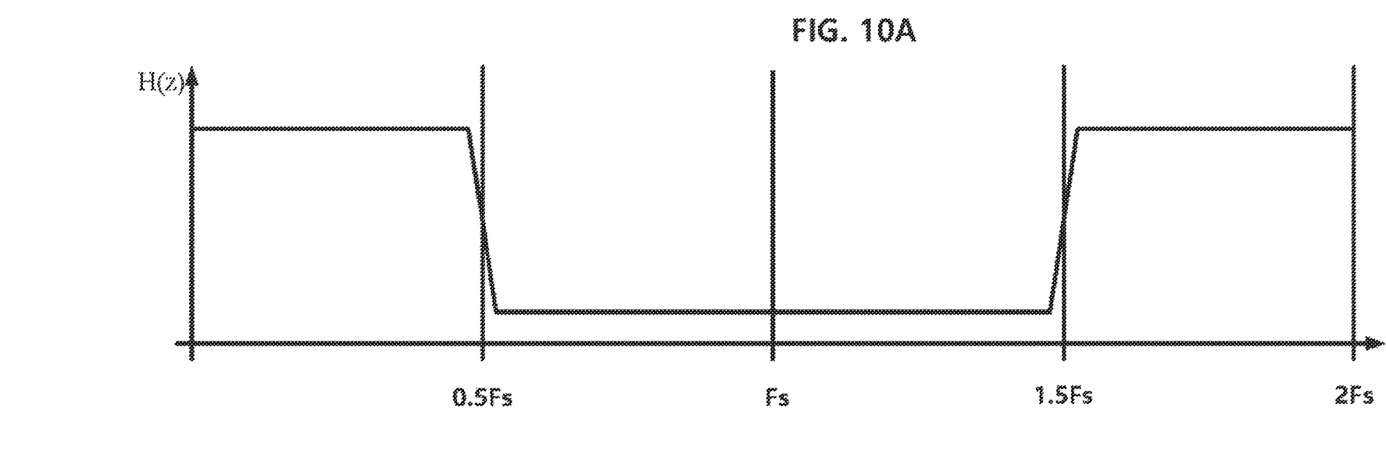
FIGS. 10A and 10B are graphs showing frequency characteristics for the correction operation according to an embodiment of the present disclosure.
Figure 10B:
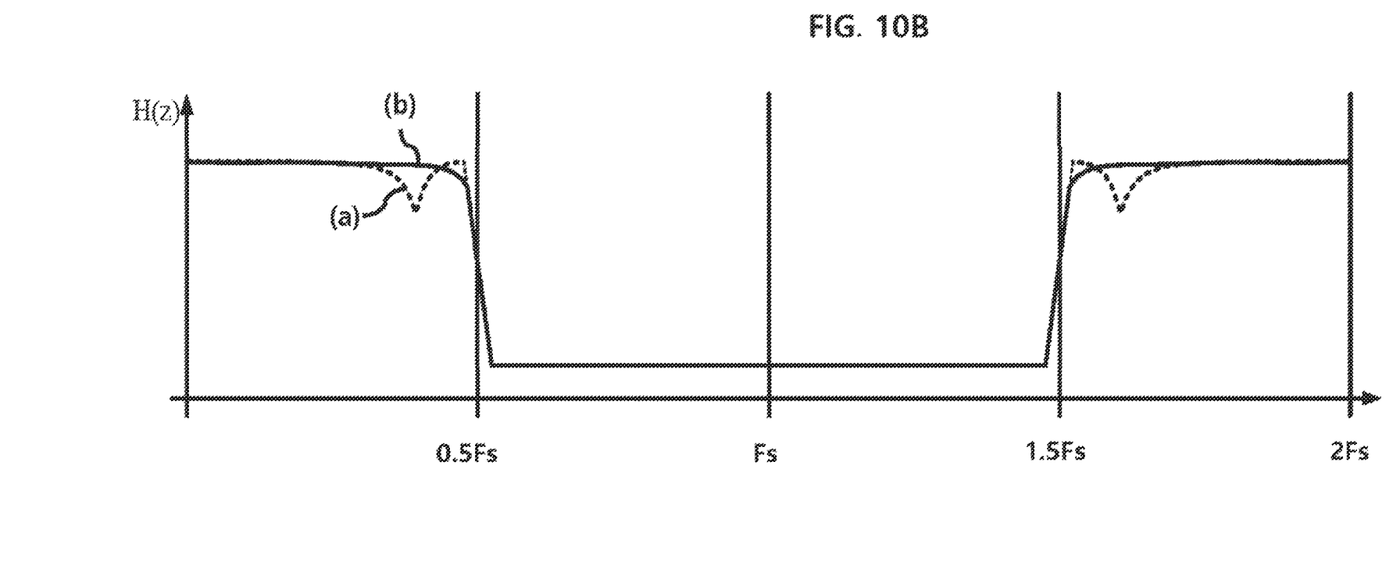

FIGS. 10A and 10B are graphs showing frequency characteristics required for the correction operation.

FIG. 10A shows frequency characteristics of a general FIR filter.

FIG. 10B shows frequency characteristics of the third filter 230.

In FIG. 10B, (a) shows a case where a resonant frequency exists in the signal band as shown in FIG. 1 and (b) shows a case where a resonant frequency exists outside the signal band as shown in FIG. 2.

Figure 11A:
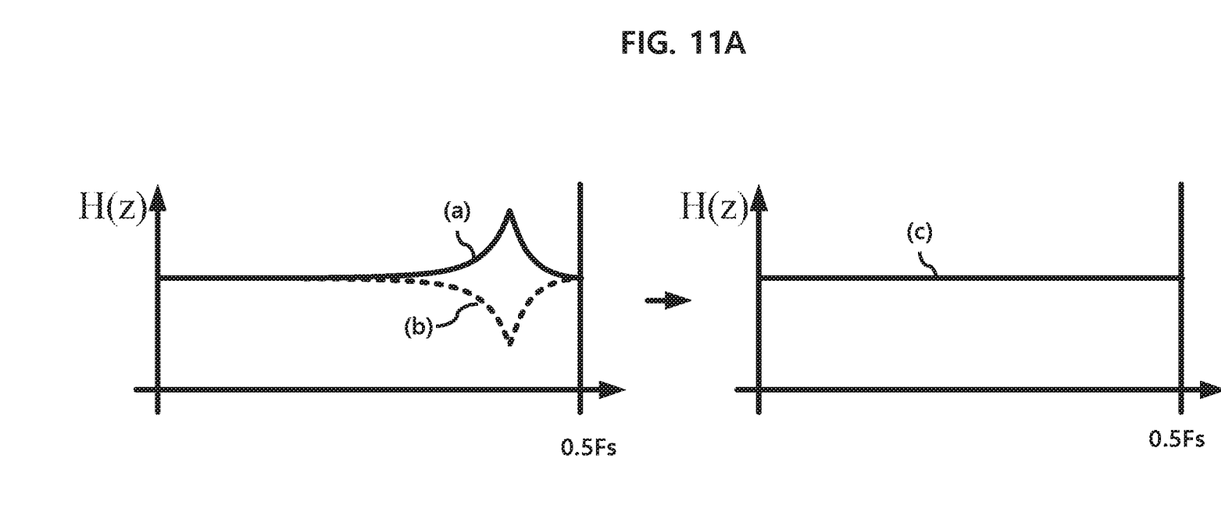
FIGS. 11A and 11B show graphs illustrating frequency characteristics correction operation according to an embodiment of the present disclosure.
Figure 11B:
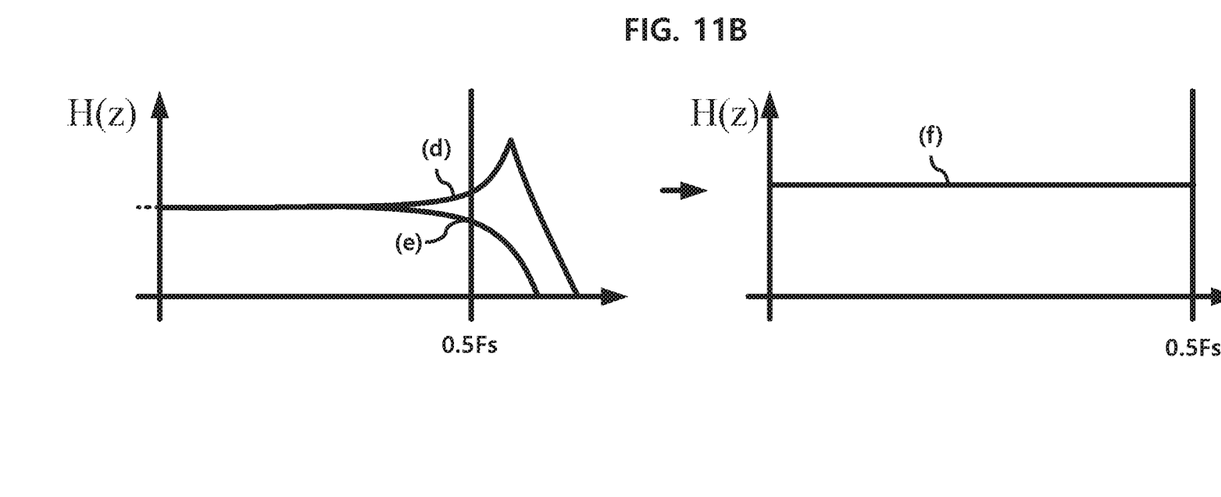

FIGS. 11A and 11B are graphs illustrating changes in frequency characteristics due to a correction operation.

FIG. 11A illustrates a case where a resonant frequency exists in the signal band, in which (a) shows frequency characteristics of the transducer 1 and (b) shows frequency characteristics of the third filter 230.

By mixing the frequency characteristics of (a) and (b), a signal having a flat characteristics in the signal band is output as shown in (c).

FIG. 11B illustrates a case where a resonant frequency exists outside the signal band, in which (d) shows a frequency characteristics of the transducer 1 and (e) shows a frequency characteristics of the third filter 230.

By mixing the frequency characteristics of (d) and (e), a signal having a flat characteristics in the signal band is output as shown in (f).

As described above with reference to the graph, when the frequency characteristics of the transducer is determined from the output of the SDM 100, the frequency characteristics of the third filter for compensating for this may be determined.

Determining the filter control signal corresponding to a desired frequency characteristics of the third filter may be accomplished by applying a conventional technology. Therefore, a detailed description thereof will be omitted.

In the embodiment, the semiconductor device does not require a separate analog filter for filtering an output signal from the transducer 1, which makes size of the semiconductor device small and makes power consumption and cost for the semiconductor device be reduced.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. An analog-to-digital converter (ADC) comprising:
   a modulator configured to oversample an input signal generated from an output signal of a transducer; and
   a filter configured to perform a decimation operation on an output from the modulator and a frequency characteristics correction operation according to a filter control signal on the output from the modulator,
   wherein the frequency characteristics correction operation is performed to complement a frequency characteristics of the output signal of the transducer such that overall frequency characteristics of a signal output form the ADC be flat in a signal band, and
   wherein the filter control signal is externally provided.

2. The ADC of claim 1, wherein the modulator is a sigma delta modulator (SDM).

3. The ADC of claim 1, wherein the filter includes a decimation filter and a correction filter, wherein the correction filter is controlled according to the filter control signal and performs the frequency characteristics correction operation.

4. The ADC of claim 3, wherein the decimation filter includes a cascaded integrator and comb (CIC) filter.

5. The ADC of claim 4, wherein the decimation filter includes an integrator, a sample remover, and a comb filter.

6. The ADC of claim 3, wherein each of the decimation filter and the correction filter includes a finite impulse response (FIR) filter or an infinite impulse response (IIR) filter.

7. The ADC of claim 3, wherein the correction filter includes:
   a plurality of unit delay elements configured to sequentially delay a digital input signal;
   a plurality of unit amplifiers configured to amplify the digital input signal and outputs of the plurality of unit delay elements according to the filter control signal;
   an adder configured to add outputs of the plurality of unit amplifiers; and
   a sample remover configured to remove one or more samples from output from the adder.

8. The ADC of claim 3, wherein the correction filter includes:
   a plurality of unit delay elements configured to sequentially delay a digital input signal;
   a plurality of sample removers configured to remove one or more samples from the digital input signal and outputs of the plurality of unit delay elements;
   a plurality of unit amplifiers configured to amplify outputs of the plurality of sample removers according to the filter control signal; and
   an adder configured to add outputs of the plurality of unit amplifiers.

9. The ADC of claim 1, further comprising a monitoring device configured to monitor an output of the modulator and to control the filter such a gain of an output of the ADC be substantially constant in a signal band.

10. A semiconductor device comprising:
    a transducer; and
    an analog-to-digital converter (ADC), wherein the ADC includes:
    a modulator configured to oversample an input signal generated from an output signal of a transducer; and
    a filter configured to perform a decimation operation on an output from the modulator and a frequency characteristics correction operation according to a filter control signal on the output from the modulator, and
    wherein the frequency characteristics correction operation is performed to complement a frequency characteristics of the output signal of the transducer such that overall frequency characteristics of a signal output from the ADC be flat in a signal band, and
    wherein the filter control signal is externally provided.

11. The semiconductor device of claim 10, wherein the modulator is a sigma delta modulator (SDM).

12. The semiconductor device of claim 10, wherein the filter includes a decimation filter and a correction filter, wherein the correction filter is controlled according to the filter control signal and performs the frequency characteristics correction operation.

13. The semiconductor device of claim 12, wherein the decimation filter includes a cascaded integrator and comb (CIC) filter.

14. The semiconductor device of claim 13, wherein the decimation filter includes an integrator, a sample remover, and a comb filter.

15. The semiconductor device of claim 12, wherein each of the decimation filter and the correction filter includes a finite impulse response (FIR) filter or an infinite impulse response (IIR) filter.

16. The semiconductor device of claim 12, wherein the correction filter includes:
    a plurality of unit delay elements configured to sequentially delay a digital input signal;
    a plurality of unit amplifiers configured to amplify the digital input signal and outputs of the plurality of unit delay elements according to the filter control signal;
    an adder configured to add outputs of the plurality of unit amplifiers; and
    a sample remover configured to remove one or more samples from output of the adder.

17. The semiconductor device of claim 12, wherein the correction filter includes:
    a plurality of unit delay elements configured to sequentially delay a digital input signal;
    a plurality of sample removers configured to remove one or more samples from the digital input signal and outputs of the plurality of unit delay elements;
    a plurality of unit amplifiers configured to amplify outputs of the plurality of sample removers according to the filter control signal; and an adder configured to add outputs of the plurality of unit amplifiers.

18. The semiconductor device of claim 10, further comprising a monitoring device configured to monitor an output of the modulator and to control the filter such that gain of an output of the ADC be substantially constant in a signal band.

19. The semiconductor device of claim 10, further comprising an amplifier configured to buffer or amplify an output of the transducer and provide an output signal thereof as the input signal of the ADC.

* * * * *